US012809263B2

(12) United States Patent
Zhang et al.

(10) Patent No.: US 12,809,263 B2
(45) Date of Patent: Nov. 24, 2026

(54) DIGITAL LITHOGRAPHY APPARATUS WITH AUTOFOCUS POSITION CONTROL AND METHODS OF USE THEREOF

(71) Applicant: Applied Materials, Inc., Santa Clara, CA (US)

(72) Inventors: Zhongchuan Zhang, Fremont, CA (US); Rendong Lin, San Jose, CA (US); Meenaradchagan Vishnu, San Jose, CA (US); Tamer Coskun, San Jose, CA (US); Ulrich Mueller, Berkley, CA (US); Thomas L. Laidig, Richmond, CA (US); Jang Fung Chen, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 141 days.

(21) Appl. No.: 18/555,896

(22) PCT Filed: Apr. 17, 2023

(86) PCT No.: PCT/US2023/018854
§ 371 (c)(1),
(2) Date: Oct. 18, 2023

(87) PCT Pub. No.: WO2023/205093
PCT Pub. Date: Oct. 26, 2023

(65) Prior Publication Data

US 2025/0076768 A1 Mar. 6, 2025

Related U.S. Application Data

(60) Provisional application No. 63/332,557, filed on Apr. 19, 2022.

(51) Int. Cl.
*G03F 7/20* (2006.01)
*G03F 9/00* (2006.01)

(52) U.S. Cl.
CPC .......... *G03F 7/2051* (2013.01); *G03F 9/7026* (2013.01)

(58) Field of Classification Search
CPC ................................ G03F 9/7026; G02B 7/09
See application file for complete search history.

(56) References Cited

U.S. PATENT DOCUMENTS

| | | | | |
|---|---|---|---|---|
| 4,512,642 A * | 4/1985 | Ito | G03F 9/7026 250/201.3 |
| 5,121,160 A | 6/1992 | Sano et al. | |

(Continued)

FOREIGN PATENT DOCUMENTS

| | | |
|---|---|---|
| CN | 102495534 B | 12/2013 |
| JP | H06104519 A | 4/1994 |

(Continued)

OTHER PUBLICATIONS

International Search Report and Written Opinion for International application No. PCT/US2023/018854, mailed Aug. 10, 2023, 10 pages.

(Continued)

*Primary Examiner* — Steven H Whitesell
(74) *Attorney, Agent, or Firm* — Lowenstein Sandler LLP

(57) ABSTRACT

Embodiments of the disclosure relate to digital lithography system and related methods, the system including at least one light source configured to emit a light beam onto a substrate via a lens, at least one image sensor, configured to detect a reflected light beam from the substrate via the lens, at least one motor configured to move the lens to focus the light beam onto the substrate, and a controller in communication with the at least one light source, the at least one image sensor and the at least one motor, wherein the (Continued)

controller is to actuate the at least one motor to move the lens in response to at least one signal from the at least one image sensor.

15 Claims, 8 Drawing Sheets

(56) References Cited

U.S. PATENT DOCUMENTS

| | | | | |
|---|---|---|---|---|
| 2006/0221318 | A1* | 10/2006 | Tsutsumi | G03F 9/7011 355/53 |
| 2008/0273184 | A1 | 11/2008 | Morimoto | |
| 2010/0208229 | A1 | 8/2010 | Shin | |
| 2012/0081681 | A1 | 4/2012 | Nakazawa et al. | |
| 2012/0287424 | A1* | 11/2012 | Hori | G03F 1/84 356/237.1 |
| 2019/0128825 | A1 | 5/2019 | Zhong | |
| 2019/0128925 | A1 | 5/2019 | Barthel et al. | |
| 2019/0346767 | A1 | 11/2019 | Ma | |
| 2020/0081355 | A1* | 3/2020 | Queens | G03F 7/70508 |
| 2020/0341255 | A1* | 10/2020 | Chan | G02B 21/245 |

FOREIGN PATENT DOCUMENTS

| | | | | |
|---|---|---|---|---|
| JP | H07106219 | A | 4/1995 | |
| JP | 2005197276 | A | 7/2005 | |
| JP | 2007317862 | A | 12/2007 | |
| JP | 2016509691 | A | 3/2016 | |
| KR | 940016440 | A | 7/1994 | |
| KR | 20170039815 | A | 4/2017 | |
| KR | 20190056327 | A | 5/2019 | |
| WO | 2020009764 | A1 | 1/2020 | |
| WO | WO-2020005361 | A1 * | 1/2020 | G03F 9/7026 |

OTHER PUBLICATIONS

Extended European Search Report for European Application No. 23785708.1 mailed Jul. 4, 2025, 10 Pages.

* cited by examiner

DIGITAL LITHOGRAPHY APPARATUS WITH AUTOFOCUS POSITION CONTROL AND METHODS OF USE THEREOF

RELATED APPLICATIONS

This application is a National Stage of International Application No. PCT/US23/18854, filed Apr. 17, 2023, which claims the benefit of U.S. Provisional Application No. 63/332,557 filed Apr. 19, 2022, which is incorporated by reference herein.

TECHNICAL FIELD

Embodiments of the present disclosure relate to a digital lithography apparatus having autofocus position control and methods of using such a digital lithography apparatus.

BACKGROUND

Photolithography is widely used in the manufacturing of semiconductor devices and display devices, such as liquid crystal displays (LCDs) and organic light emitting diode displays (OLED). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Digital lithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

There is a need for new apparatuses, approaches, and systems to precisely and cost-effectively create patterns on a substrate.

SUMMARY

According to various embodiments, disclosed herein is a digital lithography system, comprising at least one light source configured to emit a light beam onto a substrate via a lens; at least one image sensor, configured to detect a reflected light beam from the substrate via the lens; at least one motor configured to move the lens to focus the light beam onto the substrate; and a controller in communication with the at least one light source, the at least one image sensor, and the at least one motor, wherein the controller is configured to actuate the at least one motor to move the lens in response to at least one signal from the at least one image sensor.

In further embodiments, disclosed herein is a digital lithography system, comprising a plurality of light sources each configured to emit a light beam onto a substrate via a lens; a plurality of image sensors, each configured to detect a reflected light beam from the substrate via the lens, wherein each light source pairs with each image sensor; at least one motor configured to move the lens to focus the light beam onto the substrate; a plurality of autofocus channels each associated with at least one light source of the plurality of light sources and at least one image sensor of the plurality of image sensors; and a controller in communication with the plurality of light sources, the plurality of image sensors and the at least one motor, wherein the controller is to actuate the at least one motor to move the lens in response to one or more signals from the plurality of image sensor.

Further disclosed herein are embodiments of a method of automatically focusing a light beam in a digital lithography system, comprising directing at least one light beam from at least one light source onto a substrate via a lens; reflecting the at least one light beam from the substrate through the lens and to at least one image sensor; receiving by a controller at least one signal from the at least one image sensor, wherein the at least one signal indicates a position of the light beam on the substrate; and controlling by the controller a position of the lens to focus the light beam onto a surface of the substrate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
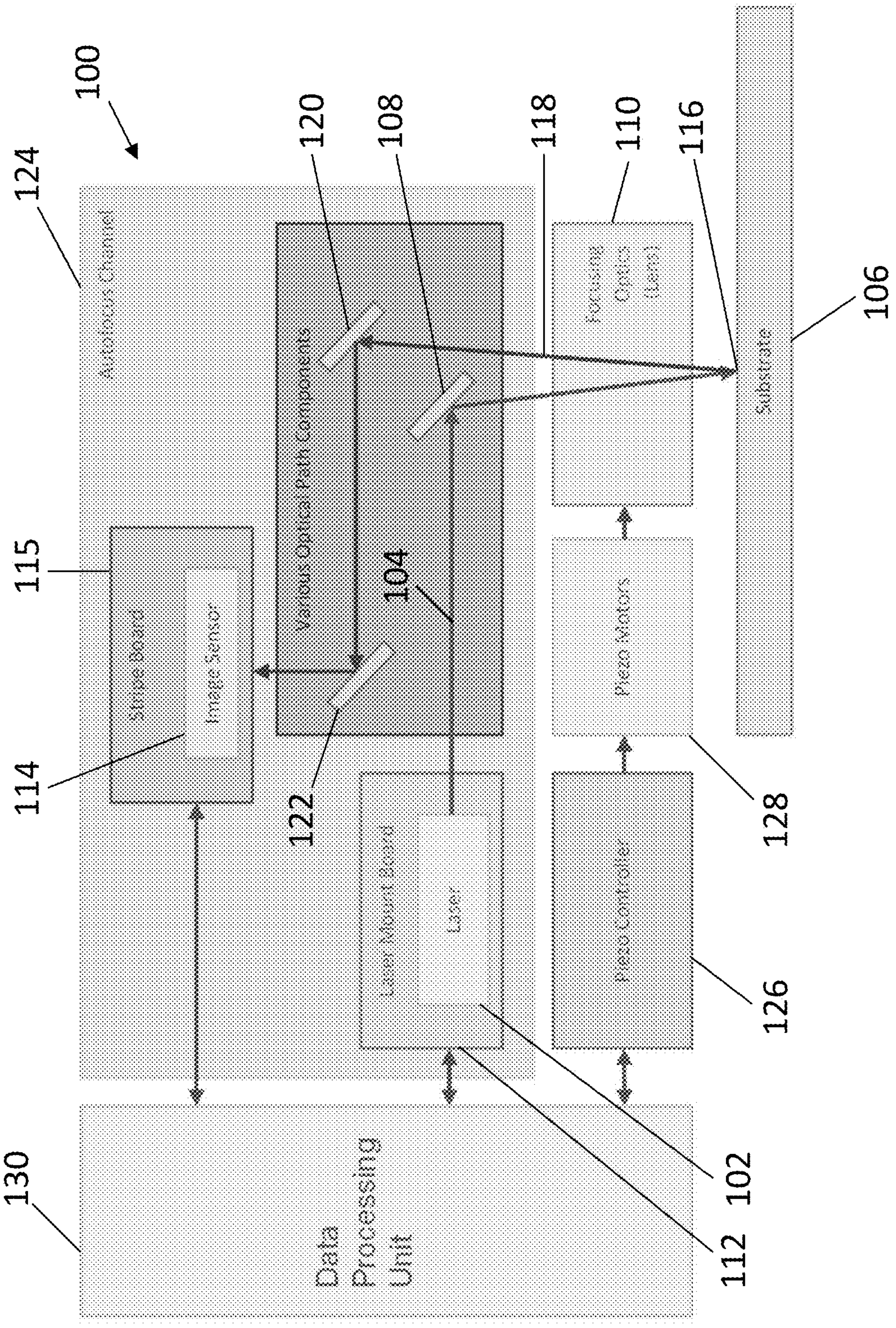
FIG. 1 shows a schematic of a digital lithography system in accordance with one or more embodiments of the disclosure.

Embodiments of the present disclosure relate to control of the position of a lens within a digital lithography tool in a robust and accurate way to provide precision focus with little or no mura. The digital lithography systems and methods print device structures using light source on a substrate (e.g., a glass substrate). Digital lithography systems and methods as described herein are used to manufacture displays, among other things. For example, a customer may order 5,000 phones and provide a pattern to a semiconductor manufacturer for these 5,000 pieces. The manufacturer may form a few hundred of those patterns per substrate. The same manufacturing process may be repeated, for example, 100 times or 200 times. The semiconductor manufacturer typically scans the first substrate as an initial reference scan. However, each substrate (e.g., glass) may be slightly different and the position may be slightly skewed one way or the other with some misalignment from machine to machine. Tracking height changes in the substrates enables a controller to move the lens to properly focus the light source during a scan.

Autofocus systems according to embodiments herein utilize one or more light beams that pass through a precision lens, and then project onto the substrate. The light source is subsequently reflected back and measured using image sensors to determine its position. In some embodiments, the substrate effectively forms a mirror with lines projected on a transparent surface with a reflective material (e.g., chrome) underneath. Because of this reflectivity, it can be difficult to identify the location of the substrate's surface. In some embodiments, when a layer of material is printed upon another layer, different types of reflectivity are created on these layers. The light beam may defocus due to these varying reflectivities. For example, the lens may drift to one side or another away from the target location. In some embodiments, the substrate contains multiple layers, each layer being transparent. A substrate may be formed of, e.g., five, six, seven, eight, or nine transparent layers. When a light beam is directed at the substrate, the signal becomes very noisy such that the system has difficulty determining the height of the surface.

In some instances, substrates may be heated and/or cooled and their heights varied, which can cause the light source to bend on the edges, for example. Systems and methods as described herein are configured to focus the light source during such conditions. When the system is not scanning a substrate, the height of the lens with respect to the substrate may change. For example, when a new substrate is placed on the stage, each individual substrate is slightly different from the other in terms of height, because substrate materials have varying thickness (e.g., on the order of microns). Sensors within the system are configured to determine this height change. Such information can be used as feedback to control the focus of the light source. When the systems and methods performing printing operations using light sources, it is beneficial to maintain the focus of the light source. The described autofocus subsystems according to embodiments herein function together with improved software control of the autofocus subsystem.

To achieve accurate focus in real-time various parameters are taken into consideration including substrate conditions (e.g., topography, reflectivity, pattern structures, etc.), chuck flatness, stage movement, metrology noise and thermal effect. Methods and systems according to embodiments herein collect such parameter data in real-time and utilize the real-time data to control the position of the light source. In some embodiments, historical parameter data (e.g., from previous scans and lithography steps) may also be used to control the position of the light source.

Systems and methods described herein improve focus accuracy of the optical lens in real-time by precisely controlling its position using a controller and motor unit. Systems and methods according to embodiments herein utilize real-time autofocus signals and empirical reference positions to determine the actual movement during printing. Such systems and methods also utilize part or all autofocus signals to drive the one or more motors on different use cases. Systems and methods according to various embodiments can minimize the mura and generate improved printing fidelity, optionally disregarding underlying layers on the substrate, the orientation/density of the underlying patterns and/or scanning speed.

In systems and methods described herein, to maintain focus, especially during high scan speeds, it is beneficial to focus the light source "on the fly." To maintain precision focus, consideration is given to various parameters including substrate conditions (e.g., topography, reflectivity and pattern structures), chuck flatness, stage movement, metrology noise and thermal effect during scanning.

Embodiments described herein utilize positioning control during high-speed scanning. The position can be determined by the following approaches: 1) autofocus signal centroids together with proportional-integral-derivative (PID) control, that is, using a PID control loop and autofocus signal centroids of all channels as the feedback to decide movement; 2) autofocus signal centroids together with a Kalman filter, that is, using a Kalman filter and autofocus signal centroids of all channels as the feedback to decide movement; 3) autofocus signal centroids together with dynamic channel selections (similar to 1)), dynamically using some, but not all, channels to determine movement; and/or 4) empirical reference positions together with real-time autofocus signal feedback; and 4) this approach is unlike approach 3), in that the position is not always determined by real-time autofocus signals. Rather, approach 4) uses both the predefined reference positions and real-time autofocus signals and the reference positions can come from a plain substrate (i.e., no underlying patterns), first layer printing, post-processed positions generated from other methods. Different approaches can be used depending on whether there are any underlying layers/patterns and/or the orientation/density of the underlying patterns.

FIG. 1 shows a schematic of a digital lithography system 100 in accordance with one or more embodiments of the disclosure. In system 100, a light source 102 is configured to project a light beam 104 to a substrate 106 via a reflector 108 and lens 110. The substrate may be formed of suitable materials including, but not limited to, glass, a reflective material, a metal, chrome, a polymer, a crystal or an oxide. The lens may be an optical lens, a spherical lens or an aspherical lens. Light source 102 may be mounted in system 100 via mounting board 112 that is configured to stabilize light source 102 during operation. Suitable light sources include, but are not limited to, a laser, a continuous wave (CW) laser, a quality (Q)-switched laser, a mode-locked laser and so on. Reflector 108 may be formed of any suitable material including, but not limited to, a mirror, glass, metal, and so on. Lens 110 may be an optical lens formed of any suitable material including, but not limited to, glass, silica, a crystalline material, a nanocrystalline material, and so on.

System 100 further includes at least one image sensor 114, which may be mounted to a stripe board 115. In some embodiments, a plurality of image sensors 114 can be mounted in rows on strip board. Image sensor 114 may be a linear image sensor, a complementary metal oxide semiconductor (CMOS) or active pixel image sensor, a charge-coupled device (CCD) image sensor, a solid-state device that converts an optical image into an analog signal in a line-by-line fashion, and so on. Image sensor 114 may be used to detect a light source spot 116 on substrate 106. As shown in FIG. 1, light beam 104 reflects off of substrate 106 at light source spot 116 directing a reflection beam 118 to reflector 120. Reflection beam 118 reflects off of reflector 120 to reflector 122 where it is directed to image sensor 114 as an autofocus signal.

In the embodiment shown in FIG. 1, system 100 has a single autofocus channel 124 although it is to be understood that in some embodiments, system 100 may include a plurality of autofocus channels. For example, system 100 may include multiple autofocus channels such that each channel is associated with a light source and a linear image sensor pair. In some embodiments, systems as described herein include at least three autofocus channels.

System 100 may further include a unit comprised of a controller 126 and one or more motors 128. Suitable controllers 126 include, but are not limited to, a proportional controller, an integral controller, a proportional-integral controller, a proportional-derivative controller or a proportional-integral-derivative (PID) controller.

Suitable motors include, but are not limited to, linear motors, for example, a piezoelectric motor, an ultrasonic motor, an ultrasonic resonant motors, a piezo stepper motor, piezo-walk motor, a piezo stick-slip motor, a flexure type motor and an inertial motor. Controller 126 is configured to actuate the one or more linear motors 128. According to embodiments, the one or more linear motors 128 move lens 110 with respect to substrate 106 to improve and/or optimize the light source's 104 focus on substrate 106. Data processing unit 130 is to send to and receive signals from the at least one image sensor 114, light source 102 and controller 126.

Figure 2:
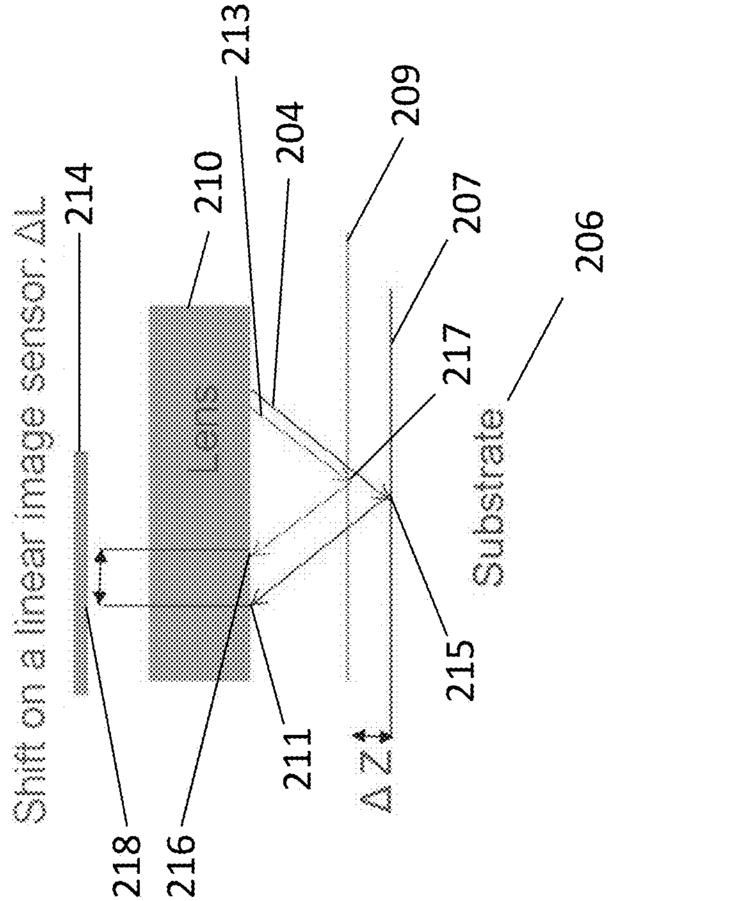
FIG. 2 shows a schematic of the change in position of a lens with respect to the surface of a substrate.

FIG. 2 shows a schematic of the change in position of lens 210 with respect to the surface 207 of substrate 206. As a substrate undergoes processing, building up layers of circuits and device features, it becomes difficult for lens 210 to focus the light beam onto the substrate's surface. Systems and methods as described herein are configured to detect the location of the substrate's surface and to optimize the focus of the light beam onto the substrate's surface.

As shown in FIG. 2, when light beam 204 passes through lens 210 to substrate 206 at spot 215, the beam 204 reflects off of the substrate 206 back to the lens 210 at 211. During a subsequent scan of the substrate 206 using the light source (not shown), the height of the substrate's surface may change, for example, from 207 to 209 as represented by ΔZ, reducing the distance between the substrate's surface and lens 210.

As shown in FIG. 2, when the height of the substrate's 206 surface shifts toward lens 210 as represented by 209, the light beam 213 reflects off of surface 209 at spot 217 and back to lens 210 at 216. According to embodiments, the change in substrate height (ΔZ) may be captured and measured by autofocus signal centroid changes. The light beam 204 generates a beam spot 218 on the linear image sensor 214 after reflecting at spot 215. The centroid of beam spot 218 is calculated and represents the relative distance between 207 and 210. Similarly, the light beam 213 generates a beam spot 219 (need to add it) on the linear image sensor 214. As such the shift (ΔL) on a linear image sensor 214 can capture the substrate height change (ΔZ).

Movement of lens 210 may be determined by one or more autofocus channels as described above, for example, the shift (ΔL) on a linear image sensor 214 resulting from a change in substrate height (ΔZ). The shift ΔL from 211 to 216 (and from spot 215 to 217) resulting from the change in height ΔZ of the substrate surface (i.e., 207 to 209), can defocus the light source and/or create mura.

Systems and methods according to embodiments herein are employed to refocus the light source, taking into consideration the height change ΔZ of the substrate's surface. In some embodiments, there is a correspondence between the incident of the light source on the substrate's surface (e.g., at spots 215, 217) and movement of the reflected light beam along the linear sensor 214. For example, measurement of a linear shift is indicative of a change in height of the substrate's surface with respect to the lens. As such, system 100 may be calibrated using the autofocus channels in order to maintain a target focus (e.g., a pixel number) during processing. A plain (uncoated) substrate may be scanned and used for the calibration. Variations in height would be based then on variations in thickness of the substrate material (e.g., glass). The substrate may be pre-scanned during printing, and then when actually printing the pixels on to the substrate, the printing is scanned in real-time. When scanning a substrate, if the actual pixel number changes, then the controller determines that the light beam is a certain number of pixels away from the target. Using a feedback loop, the controller 126 commands the linear motors 128 to move lens 110 to return the focus of the light beam 104 to the target position.

Figure 3A:
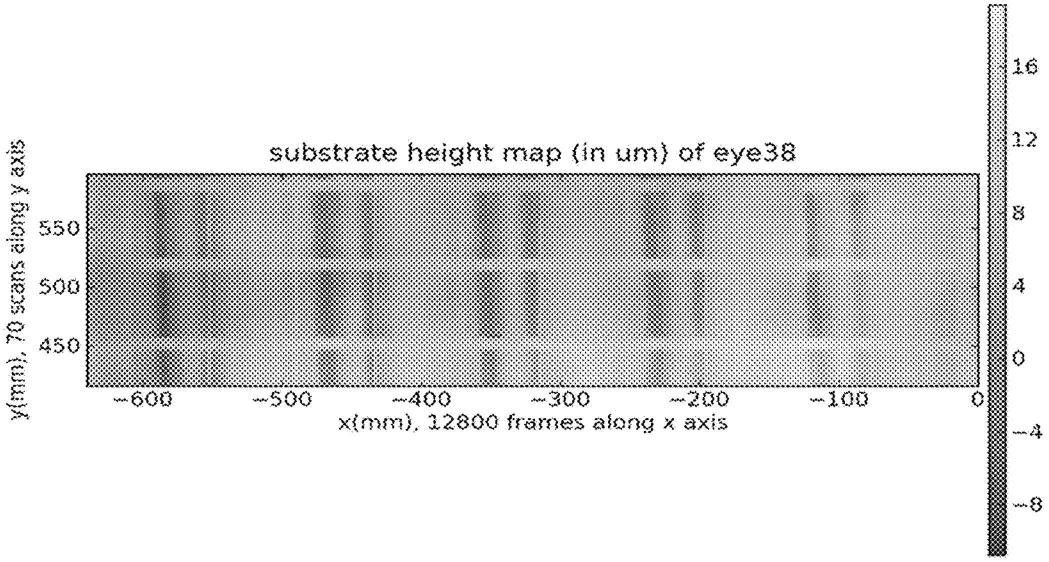
FIG. 3A shows a substrate height map depicting the defocusing of an optical lens during image scans.

FIG. 3A shows a substrate height map depicting the defocusing of an optical lens during image scans. A controller and motor unit was used to autofocus a light source within the digital lithography system. This substrate height map shows issues that can arise when the focus is not controlled during processing. During this scan, 70 scans along the y axis were performed of 12800 frames along the x axis. The substrate height map shows the topology of the substrate through the lens. The scanned substrate comprised multiple layers of devices, circuit features and films. The lens focused the light beam on the underlying features rather than on the surface of the substrate resulting in the depicted horizontal and vertical lines. If the linear motor is unable to move the lens to track the surface of the substrate, the resulting errors are larger than the depth of focus, and the printed patterns become defocused.

In one or more embodiments, the substrate may contain chrome or other metal and non-metal materials, that is, the substrate may be comprised of a combination of materials. Similarly, one area of the substrate may have a different combination of materials than other areas of the substrate. As the light source scans a substrate having such irregular materials, the light source becomes unfocused as the lens may be moved to the wrong position resulting in the lines shown in FIG. 3A. Systems and methods according to one or more embodiments herein are configured to eliminate the variations resulting from this defocusing. In other words, the light beam that reflects from the substrate may not reflect from the substrate's surface, but from an underlying device or layer within the substrate. As such, the lens attempts to focus the light beam on the underlying feature rather than on the surface that is currently being printed. This may cause the motor to move the lens to unwanted positions, defocusing the beam and resulting in the pattern shown in FIG. 3A. Systems and methods according to one or more embodiments here promote not these erroneous signals, but rather compensate for them. System sand methods described herein are configured to maintain accurate positioning control during high-speed scans. Control of the movement of the lens can minimize the mura and improve printing fidelity.

Figure 3B:
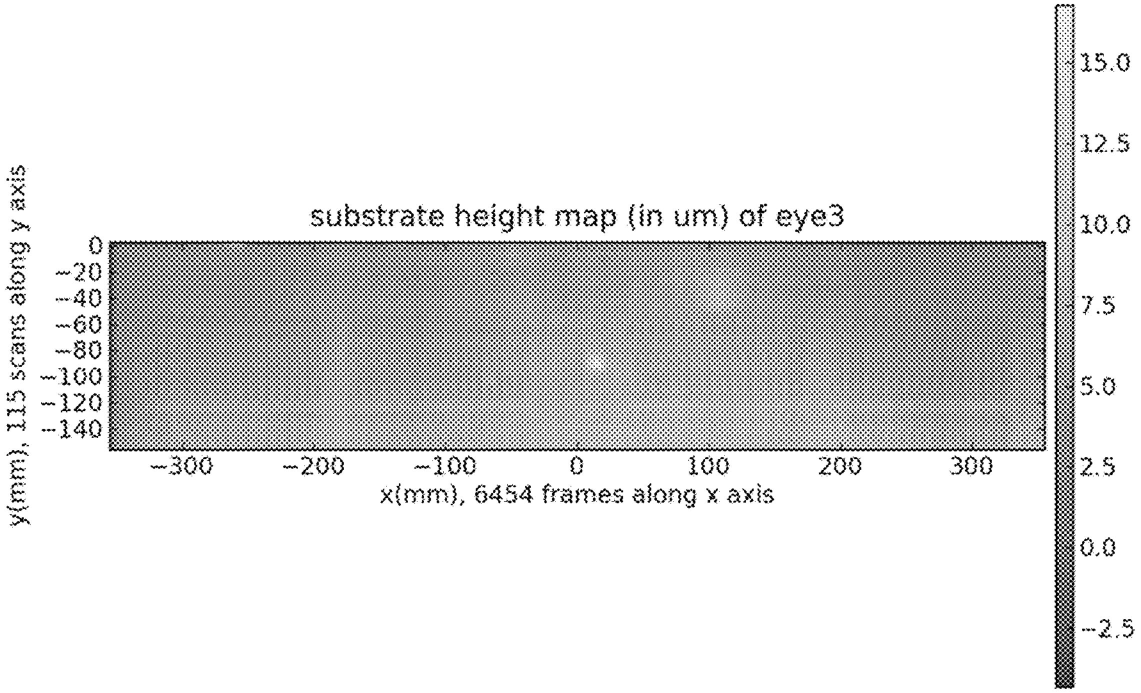
FIG. 3B shows a substrate height map depicting low-contrast non-uniform brightness regions (i.e., muras) within the image scan.

FIG. 3B shows a substrate height map depicting low-contrast non-uniform brightness regions (i.e., muras) within the image scan. In some instances, improper movement of the lens can result in muras. As shown in the substrate height map of FIG. 3B, a mura is present at about the following (x, y) coordinates: (10 mm, −80 mm).

Figure 4:
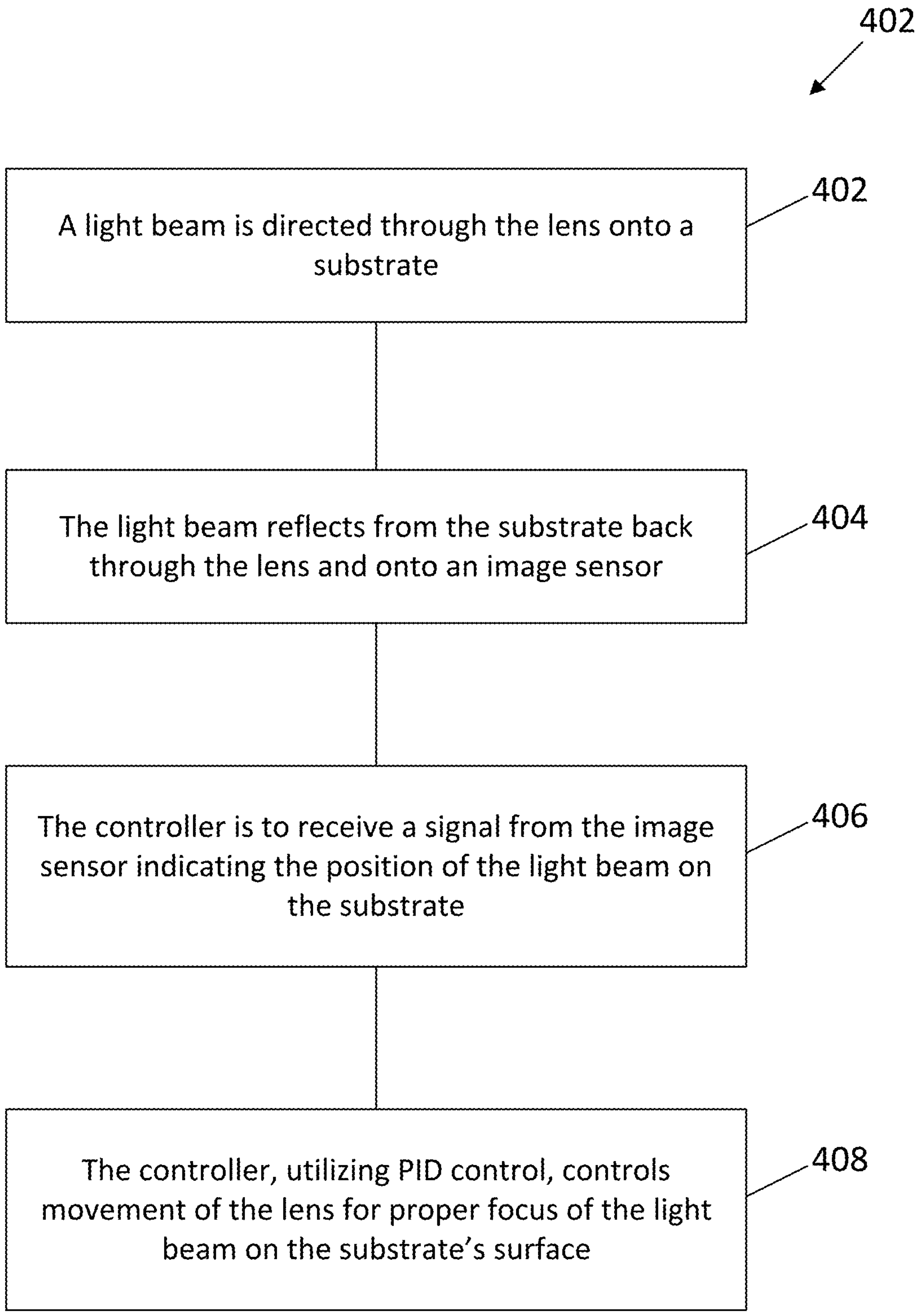
FIG. 4 shows a method of controlling the position of a lens to maintain focus of a light beam on the surface of a substrate.

According to one or more embodiments, described herein is a method 400 for controlling the position of the lens using, among other things, a controller and linear motors together with an image sensor. In one or more embodiments, the controller is calibrated to the position of the light beam along the image sensor and with respect to the height of the surface of the substrate. The control method 400 as shown in FIG. 4, utilizes autofocus signal centroids together with proportional-integral-derivative (PID) control to direct the location of the lens. At block 402, a light source projects a light beam to a substrate via a lens.

At block 404, the light beam reflects from the substrate and back through the lens. The reflected light beam shines onto an image sensor (e.g., a linear image sensor) configured to receive and detect the light beam at a plurality of locations along the length of the image sensor. As shown in FIG. 2, the reflected light beam may be used to determine the shift ΔL between the expected 211 and actual 216 positions of the light beam.

At block 406, the controller is to receive a signal from the image sensor indicating the position of the reflected light beam reflected back through lens and onto the image sensor. The controller determines a difference between the actual position of the light beam and the target position of the light beam. As shown in FIG. 2, the shift (ΔL) along the length of the reflected light beam corresponds to a change in height (ΔZ) of the substrate's surface.

At block 408, the controller determines the current height of the substrate's surface. The controller then utilizes a control method, for example, a PID control loop, together with the autofocus signal centroids of one or more channels as the feedback to determine movement of the lens for proper focus with respect to the determined height of the substrate. For example, if the lens focuses the light beam on an underlying structure below the substrate's surface, the controller moves the lens to focus the light beam onto the surface of the substrate (i.e., at a height above the underlying structure). In some embodiments, the controller uses dynamic channel selections together with the autofocus signal centroids of one or more channels as feedback. For example, the controller dynamically uses some, but not all channels, to control movement of the lens. In other embodiments, the controller uses all channels to control movement of the lens. In one or more embodiments, automatic signals are collected from the image sensor and then the centroid of these signals is determined and is used to ascertain the position.

In some embodiments, as an alternative to the PID control loop discussed above, method 400 combines a Kalman filter (i.e., linear quadratic estimation) together with the autofocus signal centroids of one or more channels as feedback. In this embodiment, the controller utilizes historical data from the autofocus signal centroids of the one or more channels combined with the current one or more channels measurements. In this embodiment, the Kalman filter also predicts how the surface height will change and the controller actuates the linear motors to move the lens to focus the light beam onto the surface of the substrate. In some embodiments, the Kalman filter is based on the following equations:

The Kalman filter model assumes the true state at time k is evolved from the state at (k−1) according to $$x_k = F_k x_{k-1} + B_k u_k + w_k$$

where

- $F_k$ is the state transition model which is applied to the previous state $x_{k-1}$;
- $B_k$ is the control-input model which is applied to the control vector $u_k$;
- $w_k$ is the process noise, which is assumed to be drawn from a zero mean multivariate normal distribution N, with covariance $Q_k$; $w_k \sim N(0, Q_k)$.

At time k an observation (or measurement) $z_k$ of the true state $x_k$ is made according to $$z_k = H_k x_k + v_k$$

where

- $H_k$ is the observation model, which maps the true state space into the observed space and
- $v_k$ is the observation noise which is assumed to be zero mean Gaussian white noise with covariance $R_k$: $v_k \sim N(0, R_k)$.

The initial state, and the noise vectors at each step $\{x_0, w_2, \ldots, w_k, v_1, \ldots v_k\}$ are all assumed to be mutually independent.

In some embodiments, as an alternative to the PID control loop discussed above, method 400 combines empirical reference positions for a substrate (e.g., a reference map of the substrate) together with real-time autofocus signal centroids of one or more channels as feedback. In some embodiments, each substrate has a reference map that is tracked with an identification code. In this embodiment, the position of the lens is not always determined by the real-time autofocus signals from one or more channels. The controller utilizes both pre-defined reference positions of the lens as controlled by the controller together with the real-time autofocus signals. The reference positions can come from a plain substrate (i.e., no underlying patterns or features), a first layer printing, post-processed positions generated from other methods and so on. In some embodiments, any of the above control approaches can be used depending on whether there are any underlying layers or patterns, the orientation or density of the underlying patterns and so on. For example, the light beam that passes through the lens may defocus due to varying reflectivities of the substrate's surface. The systems and methods described herein are configured to measure the actual height of the substrate's surface. To do this, previous information about the substrate surface's height and/or filtering are used to move the lens to maintain focus of the light beam on the substrate's surface.

Figure 5A:
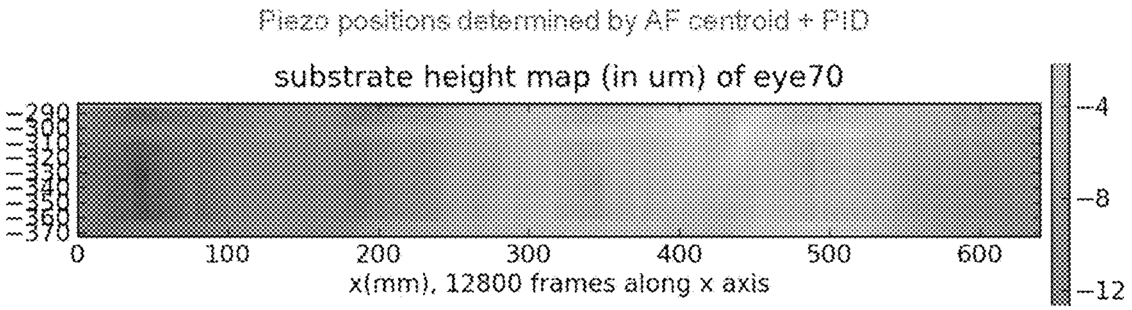
FIG. 5A shows a substrate height map depicting the substrate height measured during scans when the position is determined using proportional integral derivative control together with autofocus centroids of one or more channels.

FIG. 5A shows a substrate height map depicting the substrate height measured during scans when the position is determined using proportional integral derivative control together with autofocus centroids of one or more channels.

During this scan, 35 scans along the y axis were performed of 12,800 frames along the x axis. The controller collected autofocus signals and determined the centroid of these signals. This centroid was used by the PID controller to generate the position of the lens. In some embodiments, this method of scanning a substrate may be used on a "blank substrate" (e.g., a perfect surface, an uncoated surface).

Figure 5B:
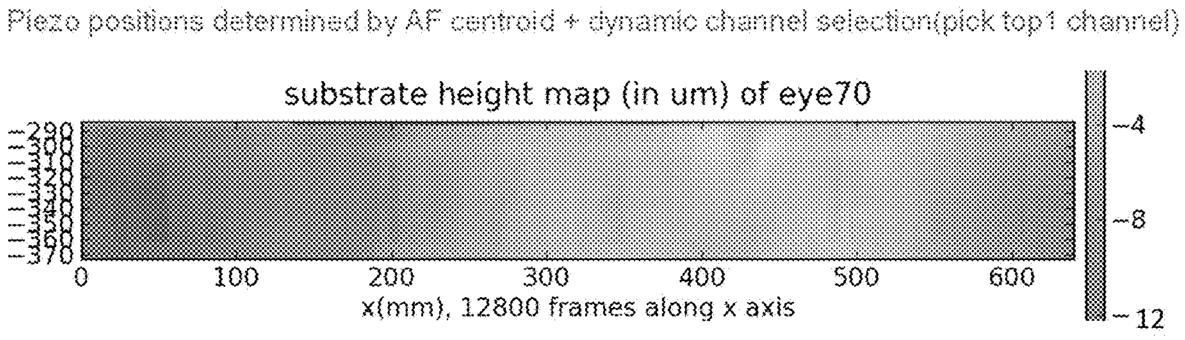
FIG. 5B shows a substrate height map depicting the substrate height measured during scans when the position is determined by dynamic channel selection control together with autofocus centroids of one or more channels.

FIG. 5B shows a substrate height map depicting the substrate height measured during scans when the position was determined by dynamic channel selection control together with autofocus centroids of one or more channels. This control method was used to dynamically select certain autofocus channels; some, but not all, channels may be used as feedback to the PID controller to determine movement. During this scan, three autofocus channels were used (i.e., three image sensors and light source pairs) and the data for each scan was stored in a memory and accessible by the controller. The data from the channel having the best signal was used in the control loop. In some embodiments, the controller can dynamically select the number of channels. During a scan, the light beam may land on a certain pixel location. Some locations may be over complicated device features, reflective materials and/or multi-layer structures. Scans at such locations may have comparatively more noise (i.e., the lens has difficulty focusing at that pixel location). The system may dynamically increase the number of channels at that location to improve the feedback signal. Using this method to control the position of the lens eliminated and/or reduced lines as shown in FIG. 3A.

Figure 6A:
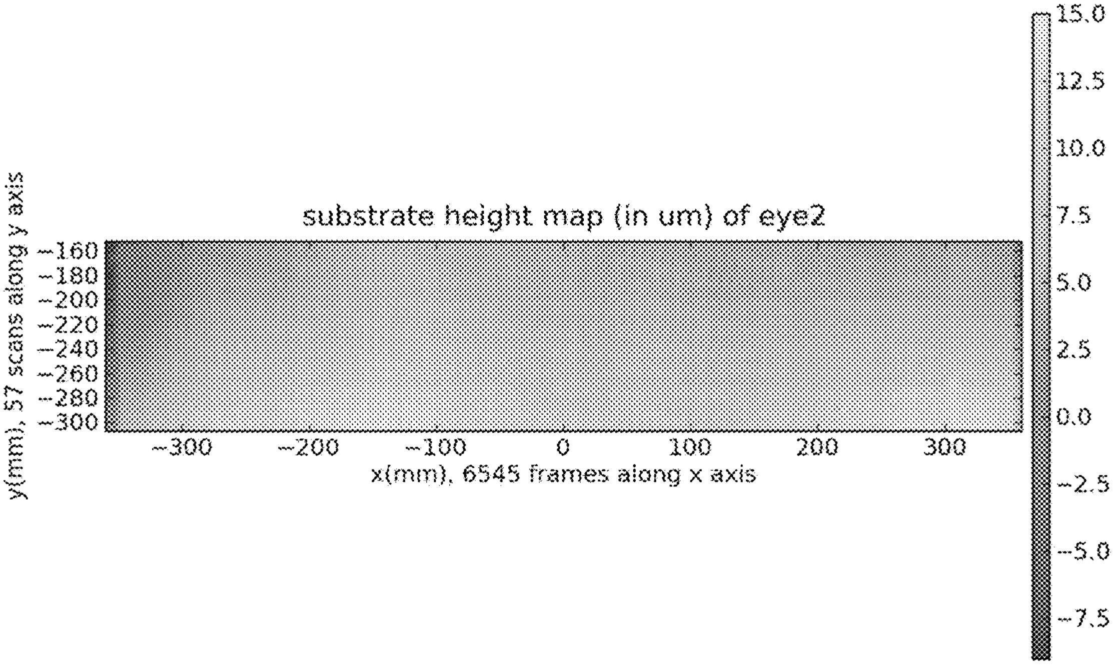
FIG. 6A shows a substrate height map depicting the substrate height measured during scans when the position is determined using proportional integral derivative control together with autofocus centroids of one or more channels.

FIG. 6A shows a substrate height map depicting the substrate height measured during scans when the position is determined using PID control together with an autofocus centroid. To generate this substrate height map, 57 scans along the y axis were performed of 6,545 frames along the x axis. Using this method to control the position of the lens eliminated and/or reduced lines as shown in FIG. 3A.

Figure 6B:
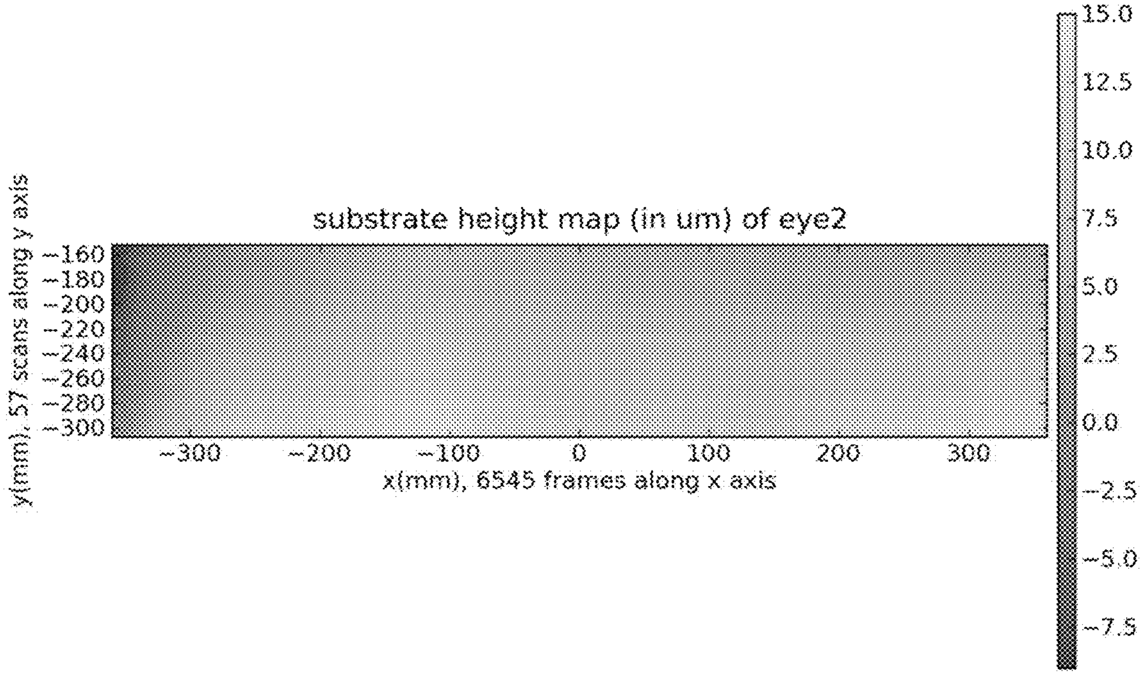
FIG. 6B shows a substrate height map depicting the substrate height measured during scans when the position is determined by a Kalman filter control method together with autofocus centroids of one or more channels.

FIG. 6B shows a substrate height map depicting the substrate height measured during scans when the position is determined by an autofocus centroid together with Kalman filter control. This method is similar to turning down the treble control on a stereo, so that only lower frequency signals pass through. In this embodiment, controlling the position of the lens using this method eliminated and/or reduced lines as shown in FIG. 3A.

Figure 7A:
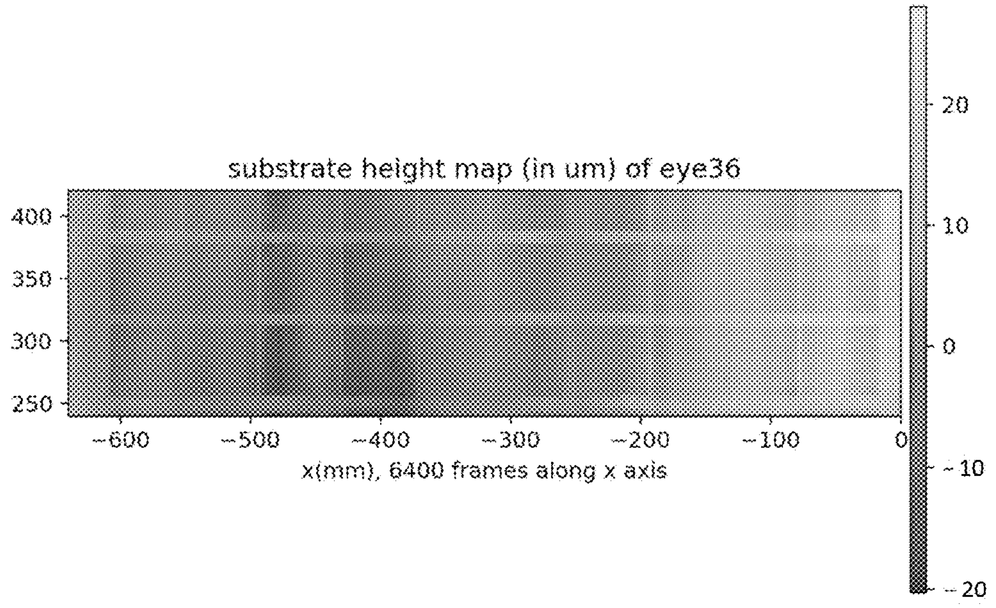
FIG. 7A shows a substrate height map depicting the substrate height measured during scans when the position is determined using proportional integral derivative control together with autofocus centroids of one or more channels.

FIG. 7A shows a substrate height map depicting the substrate height measured during scans when the position is determined by an autofocus centroid together with proportional integral derivative control. During this scan, 55 scans were performed along the y axis for 6,400 frames along the x axis. The substrate height map resulted in some line patterns.

Figure 7B:
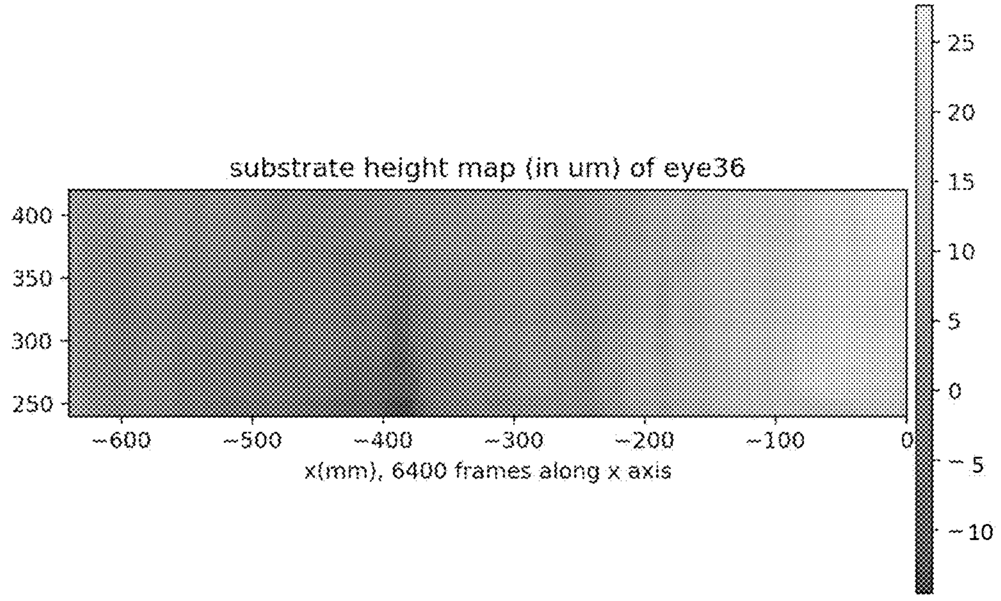
FIG. 7B shows a substrate height map depicting the substrate height measured during scans when the position is determined by reference positions together with real-time autofocus signal feedback control.

FIG. 7B shows a substrate height map depicting the substrate height measured during scans when the position is determined by reference positions together with real-time autofocus signal feedback control. During these scans, empirical reference positions were utilized. For example, the systems and methods described herein may store each data scan in a memory. Each one or more preceding layer may be utilized by the control system as a reference. This reference data (or historical data) may be utilized and combined with the real-time image sensor signal as the feedback signal in the control loop. In some embodiments, real-time signals may contain noise as a result of multiple layers within the substrate. As such, the real-time signal may be disregarded due to excessive noise.

For example, the real-time signal may be utilized when it is determined that the signal is reliable. In some embodiments, using the real-time signal for feedback, the controller knows the actual height of the substrate at a particular region (or pixel) of the substrate. This actual height can be compared with the first layer, because the reference map is stored within a memory of the system, and the difference in height can be determined. The controller will apply this difference at this corresponding pixel region. In accordance with one or more embodiments described herein, utilizing this method by the controller to actuate the linear motors to control the position of the lens, substantially reduced or eliminated the noise or line patterns shown in FIG. 7B as compared to the scan presented in FIG. 3A.

Figure 8:
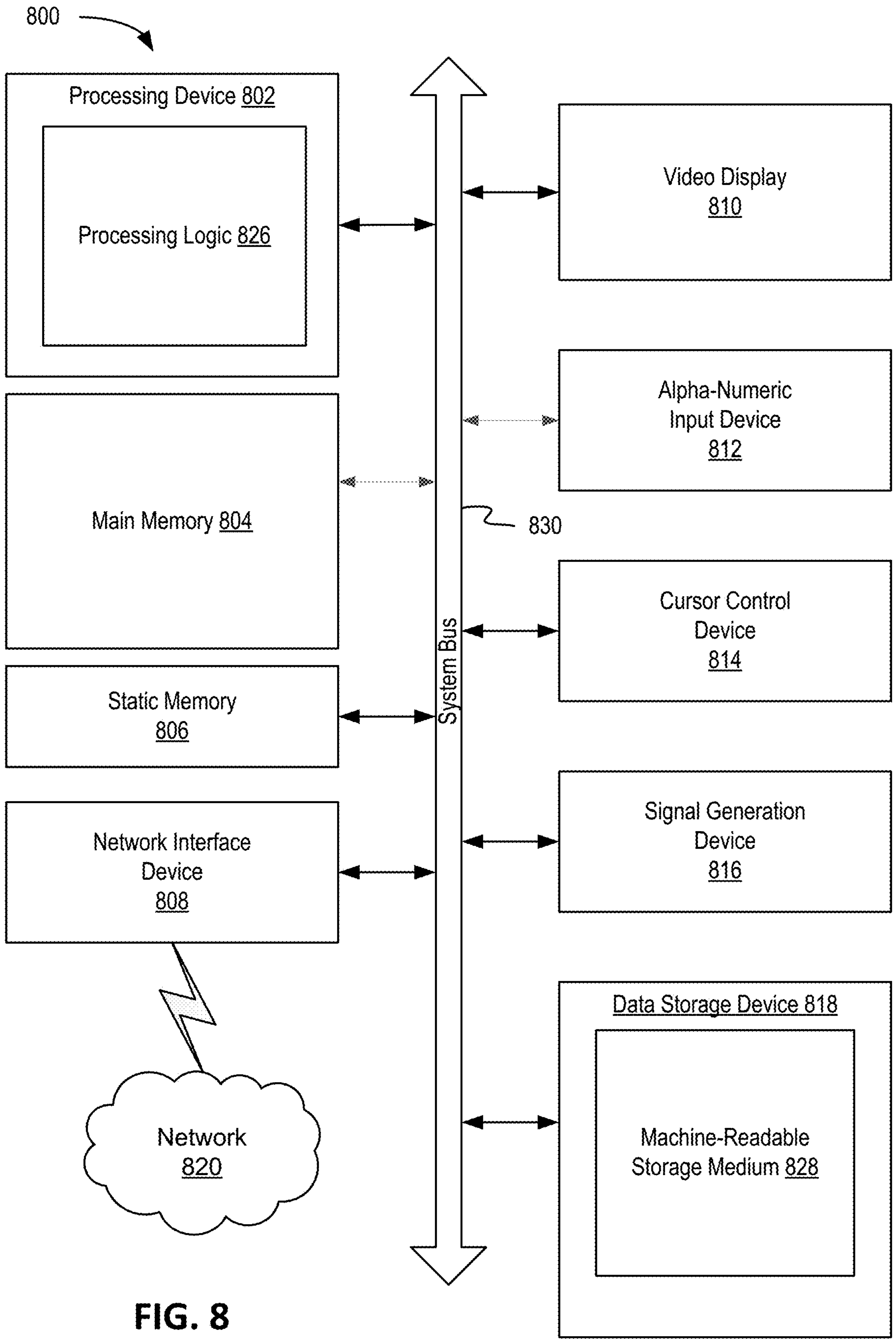
FIG. 8 depicts a diagram of an illustrative example of a computing device implementing the systems and methods described herein.

FIG. 8 illustrates a diagrammatic representation of a machine in the example form of a computer system 800 including a set of instructions executable by systems as described herein to perform any one or more of the methodologies discussed herein. In one implementation, the system may include instructions to enable execution of the processes and corresponding components shown and described in connection with FIGS. 1, 2 and 4.

In alternative implementations, the systems may include a machine connected (e.g., networked) to other machines in a LAN, an intranet, an extranet, or the Internet. The machine may operate in the capacity of a server machine in client-server network environment. The machine may be a personal computer (PC), a neural computer, a set-top box (STB), Personal Digital Assistant (PDA), a cellular telephone, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies described herein.

The example computer system 800 can include a processing device (processor) 802, a main memory 804 (e.g., read-only memory (ROM), flash memory, dynamic random access memory (DRAM) such as synchronous DRAM (SDRAM)), a static memory 806 (e.g., flash memory, static random access memory (SRAM)), and a data object storage device 818, which communicate with each other via a bus 830.

Processing device 802 represents one or more general-purpose processing devices such as a microprocessor, central processing unit, or the like. More particularly, the processing device 802 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 802 may also be one or more special-purpose processing devices such as an application specific integrated circuit (ASIC), a field programmable gate array (FPGA), a digital signal processor (DSP), network processor, or the like. In various implementations of the present disclosure, the processing device 802 is configured to execute instructions for the devices or systems described herein for performing the operations and processes described herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The data storage device 818 may include a computer-readable medium 828 on which is stored one or more sets of instructions of the devices and systems as described herein embodying any one or more of the methodologies or functions described herein. The instructions may also reside, completely or at least partially, within the main memory 804 and/or within processing logic 826 of the processing device 802 during execution thereof by the computer system 800, the main memory 804 and the processing device 802 also constituting computer-readable media.

The instructions may further be transmitted or received over a network 820 via the network interface device 808. While the computer-readable storage medium 828 is shown in an example implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

As used herein, the singular forms "a," "an," and "the" include plural references unless the context clearly indicates otherwise. Thus, for example, reference to "a precursor" includes a single precursor as well as a mixture of two or more precursors; and reference to a "reactant" includes a single reactant as well as a mixture of two or more reactants, and the like.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A digital lithography system, comprising:

at least one light source configured to emit a light beam onto a substrate via a lens;

at least one image sensor, configured to detect a reflected light beam from the substrate via the lens;

at least one motor configured to move the lens to focus the light beam onto the substrate; and a controller in communication with the at least one light source, the at least one image sensor, and the at least one motor, wherein the controller is configured to:

receive, from the at least one image sensor, at least one signal indicative of a position of the light beam on the substrate;

determine a target position of the lens to focus the light beam onto the substrate in response to receiving the at least one signal from the at least one image sensor by using, as a feedback signal, autofocus signal centroids from one or more autofocus channels of a plurality of autofocus channels associated with the at least one image sensor and the at least one light source, wherein, to determine the target position of the lens, the controller is configured to use one of:

a proportional-integral-derivative control method with dynamic channel selection that dynamically selects, from the plurality of autofocus channels, a number of autofocus channels from which the autofocus signal centroids are used to generate the feedback signal based on an amount of signal noise at a pixel location on the substrate, wherein a first amount of noise at a first pixel location on the substrate corresponds to a first number of autofocus channels, and wherein a second amount of pixel noise at a second pixel location on the substrate, greater than the first amount of pixel noise, corresponds to a second number of autofocus channels greater than the first number of autofocus channels; or an empirical reference position method that combines the feedback signal with pre-defined reference positions from an empirical reference map of the substrate, wherein the pre-defined reference positions are obtained from at least one of a plain substrate without underlying patterns, a first layer printing, or post-processed positions; and actuate the at least one motor to move the lens in accordance with the target position of the lens.

2. The digital lithography system of claim 1, wherein the at least one light source comprises at least one of a laser, a continuous wave (CW) laser, a quality (Q)-switched laser, or a mode-locked laser.

3. The digital lithography system of claim 1, wherein the substrate comprises at least one material of glass, a reflective material, a metal, chrome, a polymer, a crystal or an oxide.

4. The digital lithography system of claim 1, wherein the lens comprises at least one of an optical lens, a spherical lens, or an aspherical lens.

5. The digital lithography system of claim 1, wherein the at least one image sensor comprises at least one of a linear image sensor, a complementary metal oxide semiconductor (CMOS) or active pixel image sensor, a charge-coupled device (CCD) image sensor, or a solid-state device.

6. The digital lithography system of claim 1, wherein the at least one motor comprises a linear motor comprising at least one of a piezoelectric motor, an ultrasonic motor, an ultrasonic resonant motors, a piezo stepper motor, piezowalk motor, a piezo stick-slip motor, a flexure type motor, or an inertial motor.

7. The digital lithography system of claim 1, wherein the controller is further configured to calibrate the at least one image sensor to correlate a change in length (ΔL) of the light beam along a length of the at least one image sensor with a change in height (ΔZ) of a surface of the substrate.

8. A system, comprising:

a memory; and at least one processing device, operatively coupled with the memory, to:

receive, from at least one image sensor configured to detect a light beam reflected from a substrate via a lens, at least one signal indicative of a position of the light beam on the substrate;

determine a target position of the lens to focus the light beam on the substrate in response to receiving the at least one signal from the at least one image sensor by using, as a feedback signal, autofocus signal centroids from one or more autofocus channels of a plurality of autofocus channels associated with the at least one image sensor and at least one light source of the light beam, wherein, to determine the target position of the lens, the at least one processing device is configured to use one of:

a proportional-integral-derivative control method with dynamic channel selection that dynamically selects, from the plurality of autofocus channels, a number of autofocus channels from which the autofocus signal centroids are used to generate the feedback signal based on an amount of signal noise at a pixel location on the substrate, wherein a first amount of noise at a first pixel location on the substrate corresponds to a first number of autofocus channels, and wherein a second amount of pixel noise at a second pixel location on the substrate, greater than the first amount of pixel noise, corresponds to a second number of autofocus channels greater than the first number of autofocus channels; or an empirical reference position method that combines the feedback signal with pre-defined reference positions from an empirical reference map of the substrate, wherein the pre-defined reference positions are obtained from at least one of a plain substrate without underlying patterns, a first layer printing, or post-processed positions; and actuate at least one motor to move the lens in accordance with the target position of the lens.

9. The system of claim 8, wherein:

the substrate comprises at least one material of glass, a reflective material, a metal, chrome, a polymer, a crystal or an oxide;

the lens comprises at least one of an optical lens, a spherical lens, or an aspherical lens; and the at least one image sensor comprises at least one of a linear image sensor, a complementary metal oxide semiconductor (CMOS) or active pixel image sensor, a charge-coupled device (CCD) image sensor, or a solid-state device.

10. The system of claim 8, wherein the at least one processing device is further configured to calibrate the at least one image sensor to correlate a change in length (ΔL) of the light beam along a length of the at least one image sensor with a change in height (ΔZ) of a surface of the substrate.

11. A method comprising:

receiving, by a controller, at least one signal from at least one image sensor, wherein the at least one image sensor is configured to detect a light beam reflected from a substrate via a lens, and wherein the at least one signal indicates a position of the light beam on the substrate; and determining, by the controller in response to receiving the at least one signal, a target position of the lens to focus the light beam on the substrate by using, as a feedback signal, autofocus signal centroids from one or more autofocus channels of a plurality of autofocus channels associated with the at least one image sensor and at least one light source, wherein, determining the target position of the lens comprises using one of:

a proportional-integral-derivative control method with dynamic channel selection that dynamically selects, from the plurality of autofocus channels, a number of autofocus channels from which the autofocus signal centroids are used to generate the feedback signal based on an amount of signal noise at a pixel location on the substrate, wherein a first amount of noise at a first pixel location on the substrate corresponds to a first number of autofocus channels, and wherein a second amount of pixel noise at a second pixel location on the substrate, greater than the first amount of pixel noise, corresponds to a second number of autofocus channels greater than the first number of autofocus channels; or an empirical reference position method that combines the feedback signal with pre-defined reference positions from an empirical reference map of the substrate stored in a memory, wherein the pre-defined reference positions are obtained from at least one of a plain substrate without underlying patterns, a first layer printing, or post-processed positions; and actuating, by the controller, at least one motor to move the lens in accordance with the target position of the lens.

12. The method of claim 11, further comprising calibrating, by the controller, the at least one image sensor to correlate a change in length (ΔL) of the light beam along a length of the at least one image sensor with a change in height (ΔZ) of a surface of the substrate.

13. The method of claim 11, wherein the at least one motor is a linear motor selected from the group consisting of a piezoelectric motor, an ultrasonic motor, an ultrasonic resonant motors, a piezo stepper motor, piezo-walk motor, a piezo stick-slip motor, a flexure type motor and an inertial motor.

14. The method of claim 11, wherein the substrate comprises at least one material selected from the group consisting of glass, a reflective material, a metal, chrome, a polymer, a crystal or an oxide.

15. The method of claim 11, wherein the at least one image sensor is selected from the group consisting of a linear image sensor, a complementary metal oxide semiconductor (CMOS) or active pixel image sensor, a charge-coupled device (CCD) image sensor and a solid-state device.

* * * * *